US008547185B2

(12) United States Patent
Soman

(10) Patent No.: US 8,547,185 B2
(45) Date of Patent: Oct. 1, 2013

(54) CENTER-TAPPED INDUCTOR BALUN

(75) Inventor: Manoj Shridhar Soman, Pune (IN)

(73) Assignee: Mindtree Limited, Bangalore (IN)

(*) Notice: Subject to any disclaimer, the term of this patent is extended or adjusted under 35 U.S.C. 154(b) by 401 days.

(21) Appl. No.: 12/873,328

(22) Filed: Sep. 1, 2010

(65) Prior Publication Data

US 2012/0013417 A1 Jan. 19, 2012

(30) Foreign Application Priority Data

Jul. 19, 2010 (IN) ........................... 2041/CHE/2010

(51) Int. Cl.
*H03H 7/42* (2006.01)
*H03H 7/38* (2006.01)
*H03F 3/04* (2006.01)

(52) U.S. Cl.
USPC ................................ 333/25; 330/301; 333/32

(58) Field of Classification Search
USPC ...................................... 333/25, 32; 330/301
See application file for complete search history.

(56) References Cited

U.S. PATENT DOCUMENTS 6,466,770 B1 * 10/2002 Griffith et al. .................. 455/91
6,900,705 B2 * 5/2005 Nakamura et al. .............. 333/25
7,596,364 B2 9/2009 Sjoland
7,626,472 B2 * 12/2009 Davies-Venn et al. .......... 333/26
2010/0164533 A1 * 7/2010 Marshall et al. .............. 324/769

FOREIGN PATENT DOCUMENTS

EP 1376854 A2 1/2004

* cited by examiner

*Primary Examiner* — Benny Lee
*Assistant Examiner* — Rakesh Patel
(74) *Attorney, Agent, or Firm* — Ash Tankha; Lipton, Weinberger & Husick

(57) ABSTRACT

An electronic balun circuit is provided for converting a single-ended signal into a differential signal and vice versa, comprising a center-tapped inductor having a first node, a center-tap coupled to a constant voltage source, and a second node. A first impedance circuit is coupled with the first node and with a line carrying single-ended signal to and from the first node. A second impedance circuit is coupled with the second node. The first node receives the single-ended signal to produce a differential signal at the first and second nodes. The first and second nodes receive the differential signal to produce the single-ended signal at the first node. Both first and second impedance circuits have an impedance of $2R_L$, resulting in a total effective impedance of Rin for achieving an impedance match between the line and the first node. Furthermore, a passive network is added to balance the balun.

15 Claims, 9 Drawing Sheets

CENTER-TAPPED INDUCTOR BALUN

CROSS REFERENCE TO RELATED APPLICATIONS

This application claims the benefit of non-provisional patent application number 2041/CHE/2010 titled "Center-Tapped Inductor Balun", filed on Jul. 19, 2010 in the Indian Patent Office.

The specification of the above referenced patent application is incorporated herein by reference in its entirety.

BACKGROUND

A front-end of a typical radio receiver, for example, a mobile telephone, typically includes one or more electronic integrated circuits or chips that include suitable amplifiers, filters, mixers, and other components. The integrated circuits or chips comprising suitable amplifiers, filters, mixers, and other components convert radio frequency (RF) signals provided to the front-end by an appropriate antenna into signals for use by other parts of the receiver. The other parts of the receiver typically include one or more chips. Generally, the parts of the receiver after the front-end require differential implementation. This is necessarily true for system on chip (SoC) scenarios which are characterized by a noisy environment and varied package requirements. Furthermore, radio frequency insertion packages (RFIP) which form part of a large SoC, have high substrate and supply/ground noise coupling into the radio frequency receiver front-end. Also, the noise coupling is unpredictable and cannot be simulated. Therefore, an RFIP having less sensitivity to noise coupling should be chosen. The RFIP must also be less sensitive against package parasitic capacitance on the supply side and the ground side.

Differential implementation involves utilizing differential signaling, wherein information is transmitted electrically by means of two complementary signals, sent on two separate wires. Differential signaling is used for both analog signaling, for example, audio systems, and digital signaling, for example, Ethernet, peripheral component interconnect (PCI) express, etc. Differential signaling is particularly preferred in RF circuits because of its tolerance to ground offsets. Since, at the end of a connection, a receiver reads the difference between two signals and the receiver ignores the incoming wires' voltages with respect to ground. Small changes in ground potential between a transmitter and a receiver do not affect the receiver's ability to efficiently detect the signal. Differential signaling also improves linearity, and the package parasitic capacitance on the supply side and the ground side become a common mode. In the common mode, the package parasitic capacitance on the supply side and the ground side are conducted in the same direction on both wires carrying the differential signal.

Front-end circuits with differential signaling implementation need a balun circuit for converting a single-ended signal to a differential signal and vice versa for the antenna interface in particular and generally for other blocks. A balun is conventionally implemented using an on-chip or an off-chip transformer. Transformers are relatively expensive, occupy board space, and require more discrete components. Furthermore, components required to implement an on-chip transformer are neither easily available nor well characterized in foundries. The components also induce loss in the front-end circuits. Accordingly, there is a long felt but unresolved need for a compact electronic balun circuit that precludes the need for a transformer.

SUMMARY OF THE INVENTION

This summary is provided to introduce a selection of concepts in a simplified form that are further described in the detailed description of the invention. This summary is not intended to identify key or essential inventive concepts of the claimed subject matter, nor is it intended for determining the scope of the claimed subject The electronic circuit disclosed herein addresses the above stated need for a compact electronic balun circuit without a transformer. The electronic balun circuit disclosed herein converts an incoming single-ended electronic signal into a differential electronic signal, for example, for a receive path. A single-ended electronic signal is used in single-ended electronic signaling. Single-ended electronic signaling is a method of transmitting signals over wires. One wire carries a varying voltage that represents the single-ended electronic signal, while the other wire is connected to a reference voltage, usually ground. The electronic balun circuit also converts an incoming differential electronic signal into a single-ended electronic signal, for example, for a transmit path.

The electronic balun circuit disclosed herein comprises: a) a center-tapped inductor comprising a first node, a center-tap coupled with a signal ground, and a second node; b) a first impedance circuit having an impedance of $2R_L$ and operably coupled with the first node and a line carrying the single-ended electronic signal to and from the first node, wherein $R_L$ is impedance of the line carrying the single-ended electronic signal for example, an antenna; and c) a second impedance circuit having the impedance of $2R_L$ and operably coupled with the second node, wherein the first node receives the single-ended electronic signal to produce the differential electronic signal at the first node and the second node, and wherein the first node and the second node receives the differential electronic signal to produce the single-ended electronic signal at the first node; whereby the impedance of $2R_L$ of the first impedance circuit and the second impedance circuit results in a total effective impedance of $R_L$ for achieving an impedance match between the line carrying the single-ended electronic signal and the first node.

In an embodiment, the electronic balun circuit further comprises a passive network operably coupled with the second node. The passive network comprises one or more passive components comprising capacitors, resistors, inductors, and any combination thereof.

The first impedance circuit and the second impedance circuit may comprise multiple transistors arranged in a differential configuration to amplify the differential electronic signal. Furthermore, the electronic balun circuit may comprise a capacitor for coupling the first node with a signal ground. The capacitor is variable to allow the electronic balun circuit to be tuned for varying operating frequency of the electronic balun circuit. The electronic balun circuit may further comprise a decoupling capacitor connected between the line carrying the single-ended electronic signal and the first node.

A differential electronic signal comprises two complementary electronic signals, namely a first complementary electronic signal and a second complementary electronic signal. To convert a single-ended electronic signal to a differential electronic signal using the electronic balun circuit, the single-ended electronic signal is provided to the first node of the center-tapped inductor. The single-ended electronic signal traverses windings of the center-tapped inductor between the first node and the center-tap. The single-ended electronic signal induces a complementary electronic signal at windings between the center-tap and the second node. The single-ended electronic signal represents the first complementary electronic signal of the differential electronic signal and can be received at the first node. The complementary electronic signal at windings between the center-tap and the second node represents the second complementary electronic signal of the differential electronic signal and can be received at the second node.

To convert a differential electronic signal to a single-ended electronic signal, the first complementary electronic signal of the differential electronic signal is provided to the first node of the center-tapped inductor. The second complementary electronic signal of the differential electronic signal is provided to the second node of the center-tapped inductor. The second complementary electronic signal traverses the windings between the second node and the center-tap. The second complementary electronic signal induces a complement of the second complementary electronic signal at windings between the first node and the center-tap. The first complementary electronic signal and the complement of the second complementary electronic signal add up constructively to generate the single-ended electronic signal at the first node. The single-ended electronic signal is sent to the line carrying the single-ended electronic signal.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and instrumentalities disclosed herein.

DETAILED DESCRIPTION OF THE INVENTION

Figure 1:
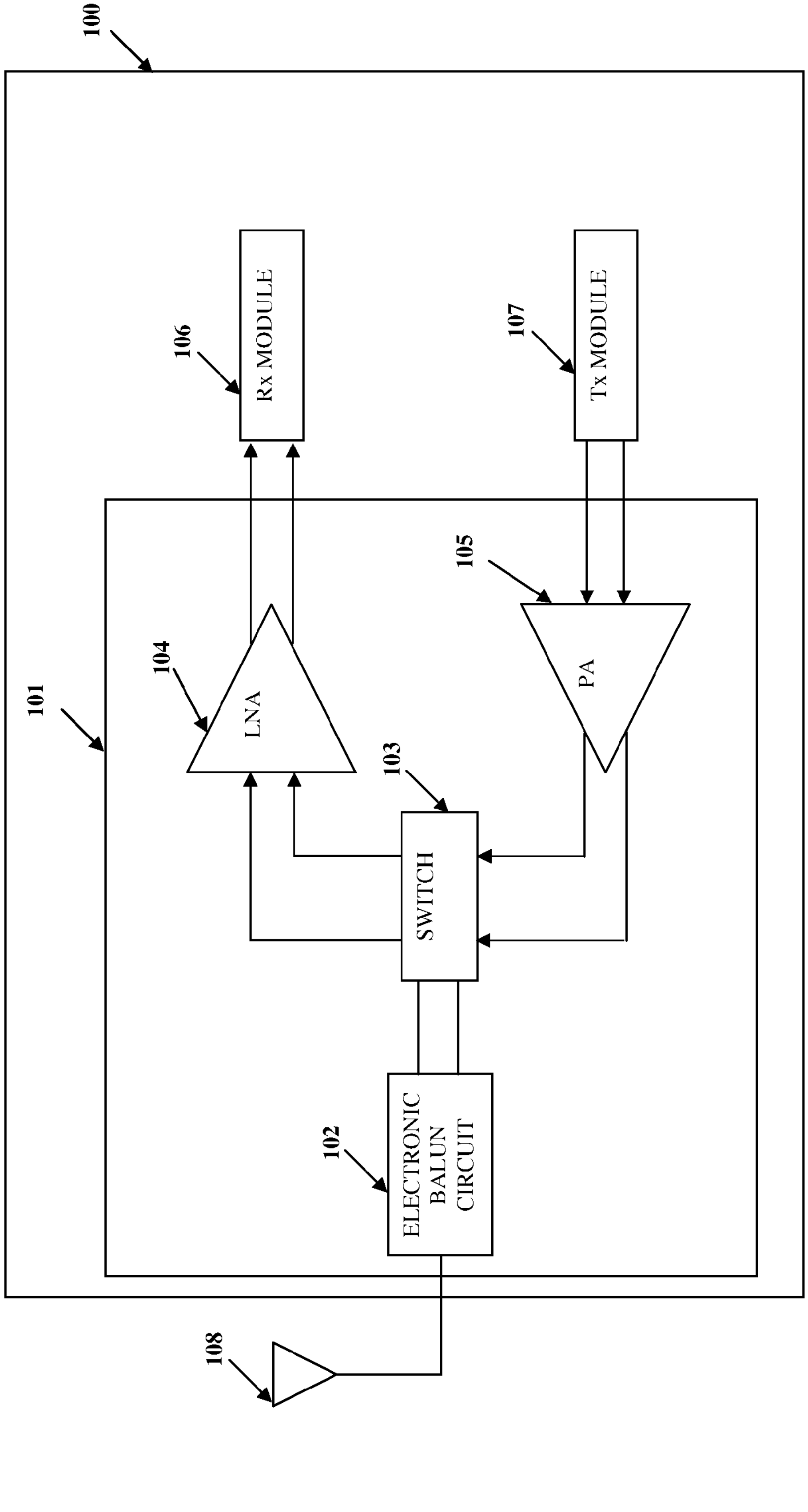
FIG. 1 illustrates a front-end of a radio frequency (RF) transceiver.

FIG. 1 illustrates a front-end 101 of a radio frequency (RF) transceiver 100. The RF transceiver 100 implements two-way radio communication and may be incorporated in wireless radio communication devices. The RF transceiver 100 comprises an antenna 108, an electronic balun (balanced/unbalanced) circuit 102, a switch 103, a low noise amplifier (LNA) 104, a power amplifier (PA) 105, a receiver (Rx) module 106, and a transmitter (Tx) module 107. The electronic balun circuit 102, the switch 103, the low noise amplifier (LNA) 104, and the power amplifier (PA) 105 form the front-end 101. The antenna 108 receives an incoming RF signal 200, illustrated in FIG. 2 and transmits an outgoing RF signal 405, illustrated in FIG. 4, from the RF transceiver 100. The electronic balun circuit 102 disclosed herein converts a single-ended electronic signal to a differential electronic signal and conversely, converts a differential electronic signal to a single-ended electronic signal. A differential electronic signal comprises two complementary electronic signals sent on two separate wires. In the RF transceiver 100, the electronic balun circuit 102 converts a single-ended electronic signal, for example, an incoming RF signal 200 from the antenna 108 into a differential electronic signal. The low noise amplifier (LNA) 104 receives the differential electronic signal from the electronic balun circuit 102 and amplifies the differential electronic signal. The receiver (Rx) Module 106 receives the amplified differential electronic signal from the low noise amplifier (LNA) 104. Conversely, the transmitter (Tx) module 107 provides a differential electronic signal. The power amplifier (PA) 105 amplifies the differential electronic signal. The electronic balun circuit 102 converts the amplified differential electronic signal to a single-ended electronic signal. The single-ended electronic signal is provided to the antenna 108 for transmission.

The switch 103 of the RF transceiver 100 facilitates utilization of the electronic balun circuit 102 and/or the antenna 108 by both the receiver (Rx) module 106 and the transmitter (Tx) module 107. The switch 103 routes an incoming differential electronic signal from the electronic balun circuit 102 to the low noise amplifier (LNA) 104 and maintains an open circuit for the outgoing differential electronic signal from the power amplifier (PA) 105. Conversely, the switch 103 routes an outgoing differential electronic signal from the power amplifier (PA) 105 to the electronic balun circuit 102 and maintains an open circuit for an incoming single-ended electronic signal 200.

Figure 2:
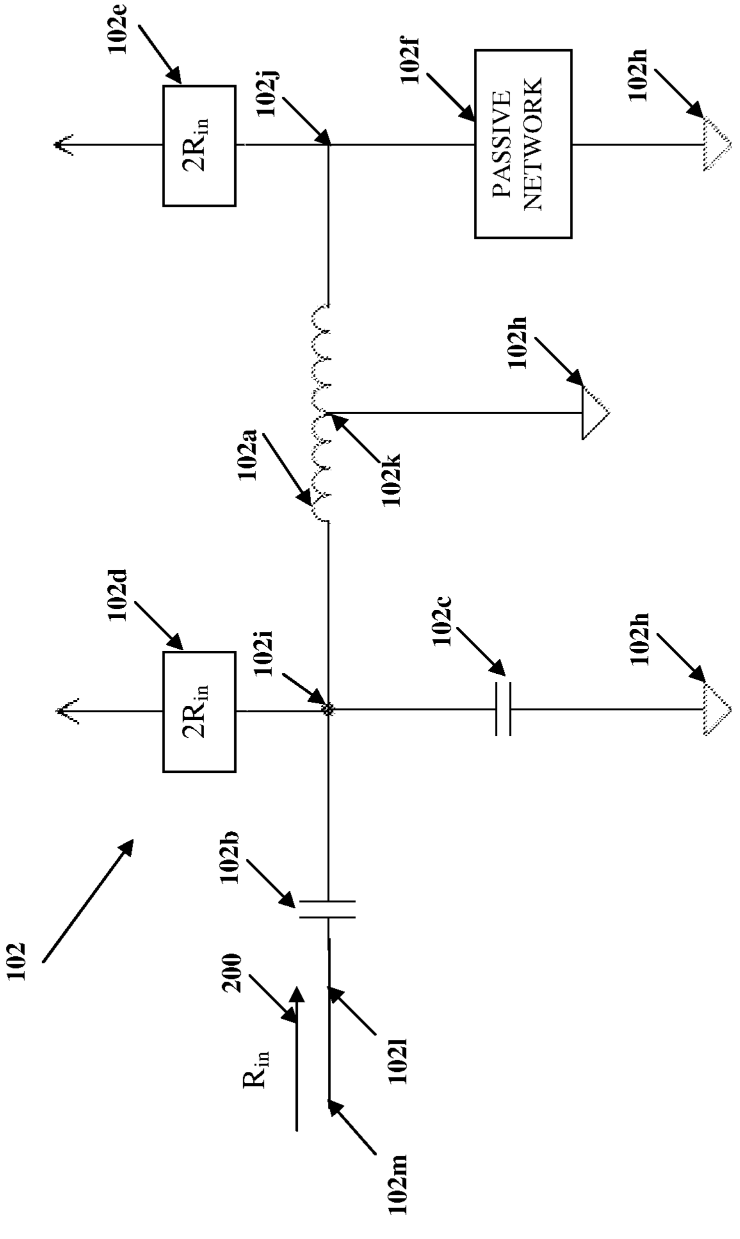
FIG. 2 illustrates an electronic balun circuit.

FIG. 2 illustrates the electronic balun circuit 102. The electronic balun circuit disclosed herein provides an electronic circuit arrangement for utilizing a center-tapped inductor 102*a* for converting a single-ended electronic signal to a differential electronic signal and vice versa. The center-tapped inductor 102*a* comprises a first node 102*i*, a second node 102*j*, and a center-tap 102*k*. The center-tap 102*k* is coupled with a constant voltage source. A constant voltage source is, for example, any voltage source that provides a voltage supply. Examples of constant voltage sources are a signal ground 102*h* as exemplarily illustrated in FIG. 2, a constant supply voltage $V_{DD}$ 404 as exemplarily illustrated in FIG. 4, etc. The signal ground 102*h* is also referred to as a small signal ground 102*h* or an alternating current (AC) ground 102*h*.

The electronic balun circuit 102 further comprises a first impedance circuit 102*d*. Input of the first impedance circuit 102*d* is operably coupled with the first node 102*i* of the center-tapped inductor 102*a* and also with a line 102*l* carrying a single-ended electronic signal to the first node. The first impedance circuit 102*d* has an input impedance of 2Rin, where Rin is the impedance of the line 102*l* carrying the single-ended electronic signal to the first node 102*i*. Rin may also comprise an output impedance of a single-ended signal source, for example, the antenna 108 illustrated in FIG. 1 that is attached to the opposite end 102*m* of the line 102*l* carrying the single-ended electronic signal to the first node 102*i*. The electronic balun circuit 102 further comprises a second impedance circuit 102*e* also having an input impedance of 2Rin. The second impedance circuit 102*e* is operably coupled with the second node 102*j*.

A capacitor 102*c* couples the first node 102*i* to the signal ground 102*h* and represents an explicit capacitor 102*c* used to tune the electronic balun circuit 102 for varying the operating frequency of the electronic balun circuit 102. An explicit capacitor 102*c* is a capacitor used to tune the electronic balun circuit 102. Effective capacitance at the first node 102*i* is a combination of capacitance of the explicit capacitor 102 and parasitic capacitance at the first node 102*i*, where the parasitic capacitance is an unavoidable and often unwanted capacitance that exists at the first node 102*i* due to close proximity of the first impedance circuit 102*d* and the center-tapped inductor 102*a* at the first node 102*i*. Furthermore, in an embodiment, a decoupling capacitor 102*b* is connected between the line 102*l* carrying the single-ended electronic signal and the first node 102*i*. The decoupling capacitor 102*b* blocks incoming direct current (DC) components from the single-ended signal source 108.

Furthermore, the impedance of 2Rin of the first impedance circuit 102*d* and the second impedance circuit 102*e* results in a total effective impedance of Rin for achieving an impedance match between the line 102*l* carrying the single-ended electronic signal and the first node 102*i*. Therefore, the first node 102*i* offers an impedance of Rin for a single-ended electronic signal 200, incoming through the line 102*l* from a single-ended signal source 108, for example, the antenna 108. A single-ended electronic signal 200 provided to the first node of the center-tapped inductor 102*a* in the electronic balun circuit 102 is exemplarily illustrated in FIG. 9A.

Coupling the center-tap 102*k* to a constant voltage source such as the signal ground 102*h*, illustrated in FIG. 1, and applying the single-ended electronic signal at the first node 102*i*, enables the center-tapped inductor 102*a* to induce a voltage at the second node 102*j* due to strong mutual coupling among windings of the center-tapped inductor 102*a* located between the first node 102*i* and the center-tap 102*k*, and the second node 102*j* and the center-tap 102*k*. The voltage generated at the second node 102*j* is a complementary electronic signal of the single-ended electronic signal at the first node 102*i*. The complementary electronic signal is nominally opposite in phase and nominally equal in magnitude to the single-ended electronic signal at the first node 102*i*. Accordingly, a differential electronic signal is generated at the first node 102*i* and the second node 102*j*. Due to mutual coupling, the sum of alternating current (AC) voltage at the first node 102*i* and AC voltage at the second node 102*j* of the center-tapped inductor 102*a* become nominally equal to the voltage at the center-tap 102*k*, where the AC voltage at the first node 102*i* is caused by the single-ended electronic signal and the AC voltage at the second node 102*j* is caused by the complementary electronic signal of the single-ended electronic signal. The first complementary electronic signal at the first node 102*i* is the same as the single-ended electronic signal 200 input to the first node 102*i*.

The differential electronic signal is available for transmission or for use by an adjacent electronic stage. As explained above, a differential electronic signal, for example provided by the electronic balun circuit 102, comprises a single-ended electronic signal and a complement of the single-ended electronic signal. Since the single-ended electronic signal was initially applied at the first node 102*i*, a single-ended electronic signal is available at the first node 102*i* and a complementary electronic signal of the single-ended electronic signal is available at the second node 102*j*. If the single-ended electronic signal is initially applied at the second node 102*j*, a single-ended electronic signal is available at the second node 102*j* and a complementary electronic signal of the single-ended electronic signal is available at the first node 102*i*. The single-ended electronic signal available at the first node 102*i* represents a first complementary electronic signal of the differential electronic signal. The complementary electronic signal at the second node 102*j* represents the second complementary electronic signal of the differential electronic signal. The first complementary electronic signal of the differential electronic signal available at the first node 102*i* of the center-tapped inductor 102*a* in the electronic balun circuit 102 is exemplarily illustrated in FIG. 9B. The second complementary electronic signal of the differential electronic signal available at the second node 102*j* of the center-tapped inductor 102*a* in the electronic balun circuit 102 is exemplarily illustrated in FIG. 9C.

The electronic balun circuit 102 further comprises a passive network 102*f*. The passive network 102*f* balances the differential electronic signal at the first node 102*i* and the second node 102*j*. The passive network 102*f* may either be coupled with the first node 102*i* or the second node 102*j* of the center-tapped inductor 102*a*. In an embodiment, the passive network 102*f* couples the second node 102*j* with the signal ground 102*h* and matches the amplitudes of the differential signals generated at the first node 102*i* and the second node 102*j*. The passive network 102*f* comprises, for example, passive components comprising one or more resistors, capacitors, inductors, and any combination thereof.

Figure 3:
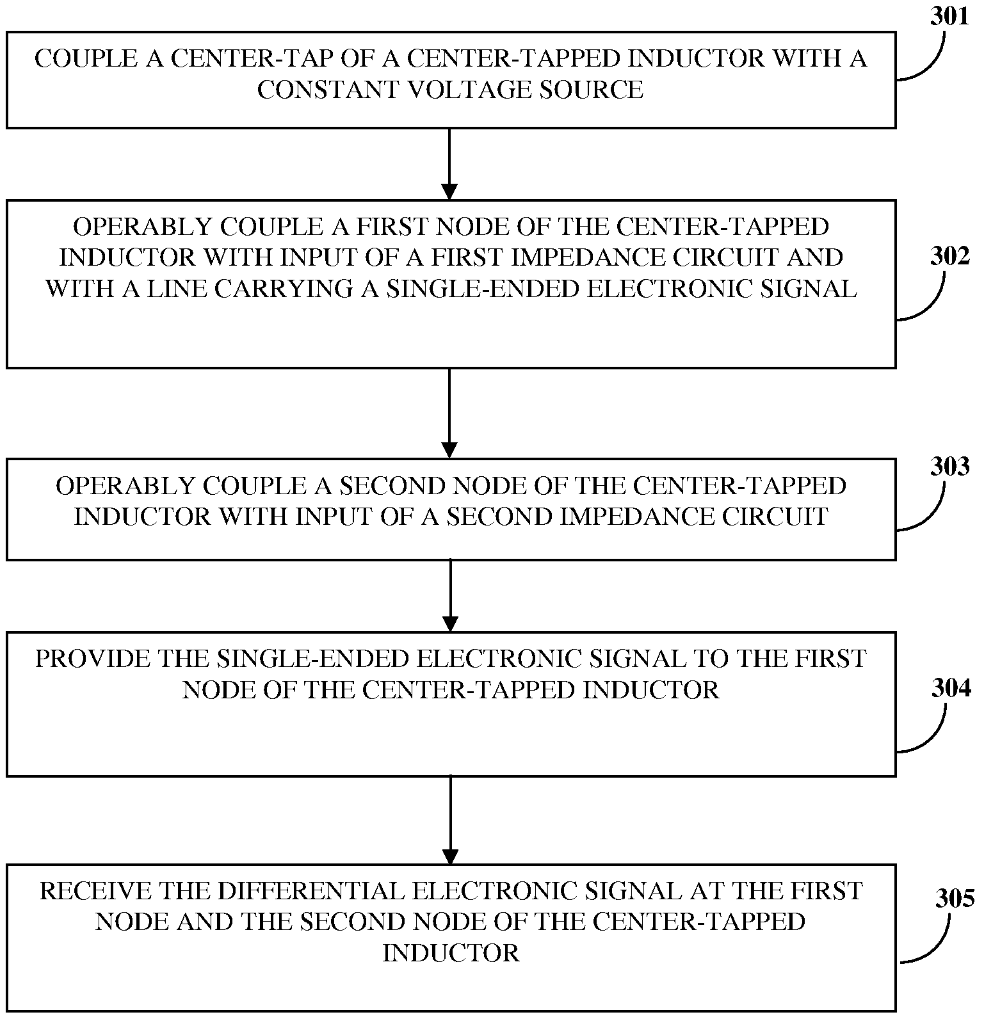
FIG. 3 illustrates a method of converting a single-ended electronic signal to a differential electronic signal in an electronic balun circuit.

FIG. 3 illustrates a method of converting a single-ended electronic signal to a differential electronic signal, in an electronic balun circuit 102. A center-tap 102*k* of a center-tapped inductor 102*a* is coupled 301 with a constant voltage source, for example, a signal ground 102*h*. A first node 102*i* of the center-tapped inductor 102*a* is operably coupled 302 with input of a first impedance circuit 102*d* and with a line 102*l* carrying the single-ended electronic signal to the first node 102*i*. The first impedance circuit 102*d* has an input impedance of 2Rin, where Rin is the impedance of the line 102*l* carrying the single-ended electronic signal. The impedance of the line 102*l* carrying the single-ended electronic signal may also comprise the output impedance of the single-ended signal source 108. Furthermore, a second node 102*j* of the center-tapped inductor 102*a* is operably coupled 303 with a second impedance circuit 102*e* having an input impedance of 2Rin. The first impedance circuit 102*d* and the second impedance circuit 102*e* are effectively in a parallel configuration, as illustrated in FIG. 2 and FIGS. 6-8. In the effective parallel configuration, the input impedance of 2Rin of the second impedance circuit 102*e* at the second node 102*j* is reflected back to the first node 102*i*. The reflected input impedance of 2Rin of the second impedance circuit 102*e* and the input impedance of 2Rin of the first impedance circuit 102*d* at the first node 102*i*, result in a total effective impedance of Rin for the single-ended electronic signal entering the first node 102*i* from the single-ended signal source 108. The resulting total effective impedance of Rin aids in achieving an impedance match between the line 102*l* carrying the single-ended electronic signal and the first node 102*i*. The single-ended electronic signal entering the first node 102*i* faces the effective impedance Rin at the first node. Therefore, providing a single-ended electronic signal from a single-ended electronic signal source for example, the antenna 108, results in a total impedance of Rin with the line 102*l* and achieves an impedance match between the line and the first node 102*i*.

The single-ended electronic signal is provided 304 to the first node 102*i* of the center-tapped inductor 102*a*. The single-ended electronic signal now traverses the windings between the first node 102*i* and the center-tap 102*k*. The single-ended electronic signal at windings between the first node 102*i* and the center-tap 102*k* induces a complementary electronic signal of the single-ended electronic signal at windings between the center-tap 102*k* and the second node 102*j* of the center-tapped inductor 102*a*. A differential signal comprising the single-ended electronic signal and the complementary electronic signal is available for reception at the first node 102*i* and the second node 102*j* of the center-tapped inductor 102*a* respectively.

Figure 4:
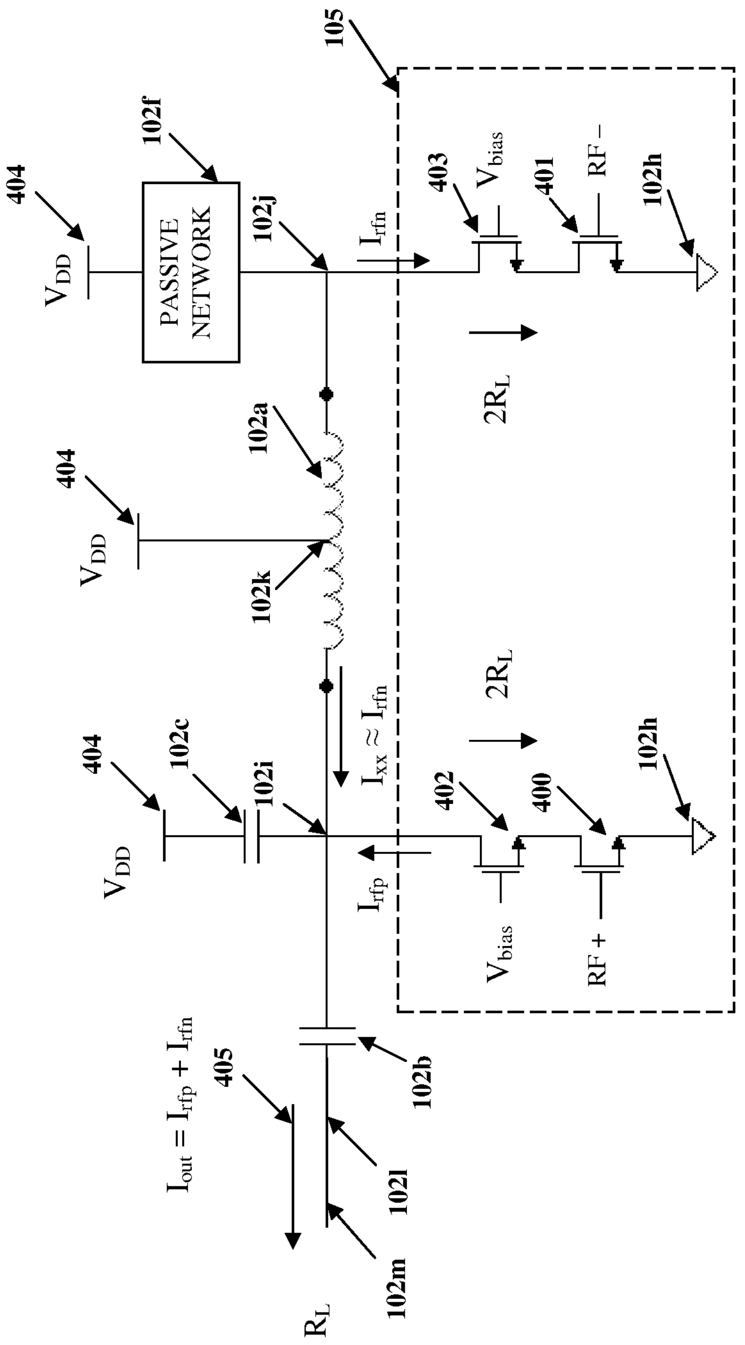
FIG. 4 exemplarily illustrates a power amplifier employing an electronic balun circuit for converting a differential electronic signal to a single-ended electronic signal.

FIG. 4 exemplarily illustrates a power amplifier (PA) 105 employing the electronic balun circuit 102 for converting a differential electronic signal into a single-ended electronic signal. The power amplifier (PA) 105 comprises four n-type metal-oxide-semiconductor field effect transistors (n-MOSFETs) 400, 401, 402, and 403. The n-MOSFETS 400 and 402 are in a first cascode configuration and the n-MOSFETS 401 and 403 are in a second cascode configuration. A cascode configuration improves input-output isolation or reverse transmission/reverse isolation, since there is no direct coupling from the output to the input. The n-MOSFETs 402 and 403 are appropriately biased by a constant bias voltage, Vbias and the source terminals of the n-MOSFETs 400 and 401 are effectively coupled with a signal ground 102*h*. The n-MOSFET 400 is a transconductance amplifier of the first cascode configuration and the n-MOSFET 401 is a transconductance amplifier of the second cascode configuration. A transconductance amplifier provides an output current proportional to its input voltage. Furthermore, the n-MOSFETS 402 and 403 are current buffers of the first cascode configuration and the second cascode configuration respectively. A current buffer is used to transfer a current from a first circuit, for example, a transconductance amplifier circuit, having a low output impedance level, to a second circuit with a high input impedance level. The interposed current buffer prevents the second circuit from loading the first circuit unacceptably and interfering with its desired operation.

As illustrated in FIG. 4, the first node 102*i* of the center-tapped inductor 102*a* is connected to a single-ended load $R_L$. The single-ended load, for example, is an antenna 108 connected through a DC blocking capacitor 102*b*. The center-tap 102*k* of the center-tapped inductor 102 is driven by a constant supply voltage $V_{DD}$ 404, which is akin to an AC ground 102*h*. The second node 102*j* is coupled with a constant supply voltage $V_{DD}$ 404 through a passive network 102*f* Likewise, the first node 102*i* is also coupled with a constant supply voltage $V_{DD}$ 404 through a capacitor 102*c*. The capacitor 102*c* represents effective capacitance at the first node 102*i* which is a combination of capacitance of an explicit capacitor used to tune the electronic balun circuit 102 to a desired operating frequency and a parasitic capacitance at the first node 102*i*. The effective capacitance at the first node 102*i* and the passive network 102*f* define the operating frequency of the electronic balun circuit 102.

Differential electronic signal components RF+ and RF− are provided to the n-MOSFETS 400 and 401 of the power amplifier (PA) 105 by the transmitter (Tx) module 107. The first node 102*i* and the second node 102*j* are then driven by the differential electronic signal amplified by the PA 105. If a first of the two complementary electronic signals of the differential electronic is provided to the first node 102*i*, the first complementary electronic signal traverses the windings between the first node 102*i* and the center-tap 102*k*. If a second of the two complementary electronic signals is provided to the second node 102*j*, the second complementary electronic signal traverses the windings between the second node 102*j* and the center-tap 102*k*. The center-tapped inductor 102*a* induces a complement of the first complementary electronic signal at the windings between the second node 102*j* and the center-tap 102*k*. The second complementary electronic signal and the complement of the first complementary electronic signal at the windings between the second node 102*j* and the center-tap 102*k* add up constructively to generate a single-ended electronic signal which is obtained at the first node 102*i*. The single-ended electronic signal is the outgoing RF signal 405 transmitted through the antenna 108, illustrated in FIG. 1.

Similarly, the center-tapped inductor 102*a* also induces a complement of the second complementary electronic signal at the windings between the first node 102*i* and the center-tap 102*k*. The first complementary electronic signal and the complement of the second complementary electronic signal at the windings between the first node 102*i* and the center-tap 102*k* add up constructively to generate a single-ended electronic signal at the first node 102*i*.

In FIG. 4, the two complementary components of the differential electronic signal amplified by the power amplifier (PA) 105 are represented by currents Irfp and Irfn. As stated above, a differential electronic signal comprises two complementary electronic signals carried on two separate wires. Irfp represents a positive current signal of the two complementary signals and Irfn represent a negative current signal of the two complementary signals. The current signals Irfp and Irfn are equal in amplitude and opposite in phase to each other. Furthermore, one or more passive components of the passive network 102*f* may be tuned to obtain a perfect matching between amplitudes of the current signals Irfp and Irfn. The negative current signal Irfn at the second node and the AC ground 102*h* at the center-tap of inductor 102*a*, along with the center-tapped inductor 102*a* operation generates an RF current signal Ixx at the first node 102*i* which is nominally equal in amplitude and opposite in phase to the negative current signal Irfn. The positive current signal Irfp and the RF current signal Ixx add up constructively at the first node 102*i* to generate a single-ended electronic signal lout, where Iout=(Irfp+Ixx)≈2*Irfp, thereby achieving differential to single-ended conversion. The impedance from the first node 102*i* for the first complementary electronic signal leaving the first node 102*i* is $2R_L$ and the impedance from the second node 102*j* for the second complementary electronic signal leaving the second node 102*j* is $2R_L$, whereas the total effective impedance for the single-ended electronic signal entering the line 102*l* carrying the single-ended electronic signal from the first node 102*i* is $R_L$. The capacitor 102*c* at the first node 102*i* represents an effective capacitance at the first node. The effective capacitance at the first node is a combination of an explicit capacitance used to tune the electronic balun circuit 102 to a desired operating frequency and a parasitic capacitance at the first node 102*i*. The effective capacitance at the first node 102*i* and the passive network 102*f* define the operating frequency of the electronic balun circuit 102.

Figure 5:
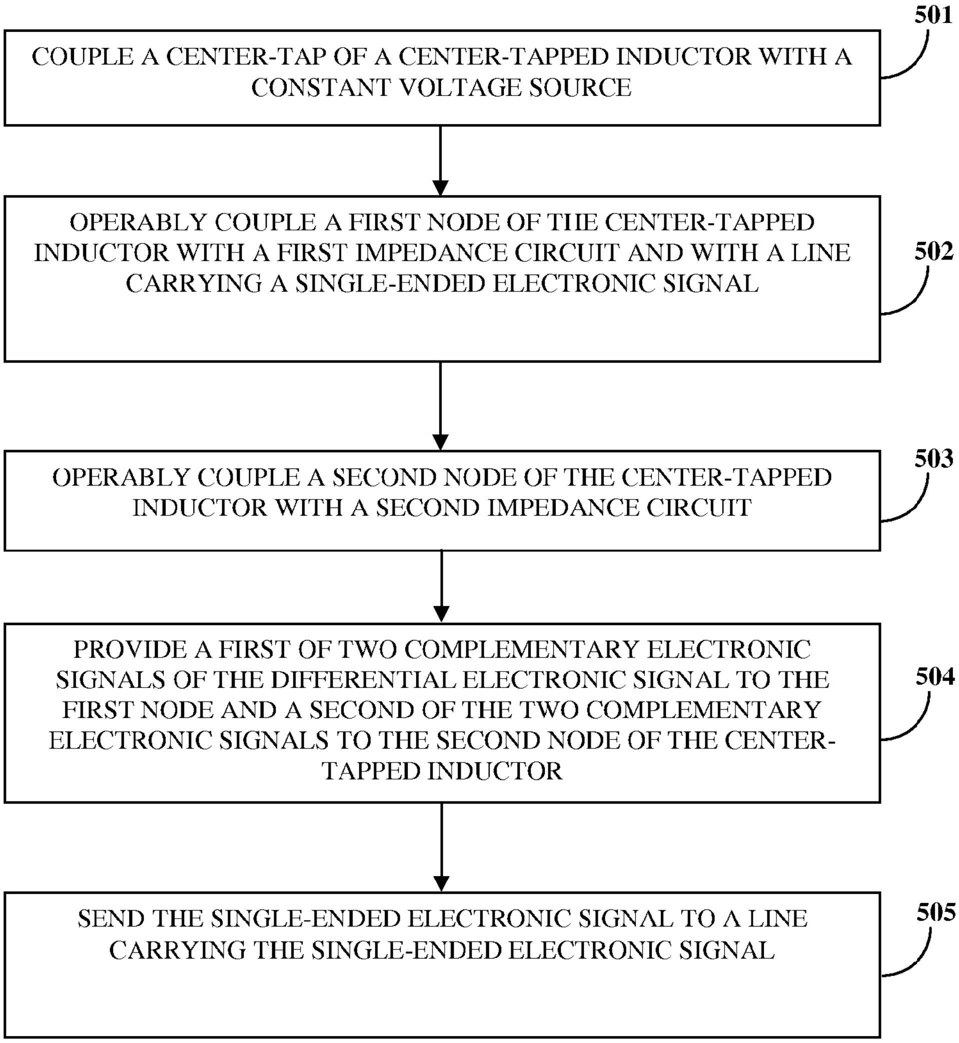
FIG. 5 illustrates a method of converting a differential electronic signal to a single-ended electronic signal in an electronic balun circuit.

FIG. 5 illustrates a method of converting an incoming differential electronic signal to a single-ended electronic signal in an electronic balun circuit 102. The center-tap 102*k* of a center-tapped inductor 102*a* is coupled 501 with a constant voltage source, for example, an AC ground, a signal ground 102*h* or a constant supply voltage $V_{DD}$ 404. The first node 102*i* of the center-tapped inductor 102*a* is operably coupled 502 with a first impedance circuit 102*d* and with a line 102*l* carrying the single-ended electronic signal from the first node 102*i*. The first impedance circuit 102*d* has an output impedance of $2R_L$, where $R_L$ is the impedance of the line 102*l* carrying the single-ended electronic signal. As disclosed above, the impedance of the line 102*l* carrying the single-ended electronic signal also comprises the output impedance of the single-ended signal source 108. Further, the second node 102*j* of the center-tapped inductor 102*a* is operably coupled 503 with a second impedance circuit 102*e* having an output impedance of $2R_L$. The first impedance circuit 102*d* and the second impedance circuit 102*e* are in an effective parallel configuration, as illustrated in FIG. 2. Therefore, the output impedance $2R_L$ of the first impedance circuit 102*d* at the first node 102*i* and the output impedance $2R_L$ of the second impedance circuit 102*e* at the second node 102*j*, in combination, result in a total effective impedance of $R_L$ for the single-ended electronic signal flowing from the first node 102*i* towards the line 102*l*. The total effective impedance of $R_L$ results in an impedance match between the line 102*l* carrying the single-ended electronic signal and the first node 102*i*.

Further, a first of the two complementary electronic signals of the differential electronic signal is provided 504 to the first node 102*i* and a second of the two complementary electronic signals of the differential signal is provided to the second node 102*j* of the center-tapped inductor 102*a*. The second complementary electronic signal at windings between the second node 102*j* and the center-tap 102*k* induces a complement of the second complementary electronic signal at windings between the first node 102*i* and the center-tap 102*k*. The first complementary electronic signal and the complement of the second complementary electronic signal add up constructively to generate a single-ended electronic signal at said first node 102*i* of the center-tapped inductor 102*a*. The single-ended electronic signal is sent 505 to the line 102*l*.

Figure 6:
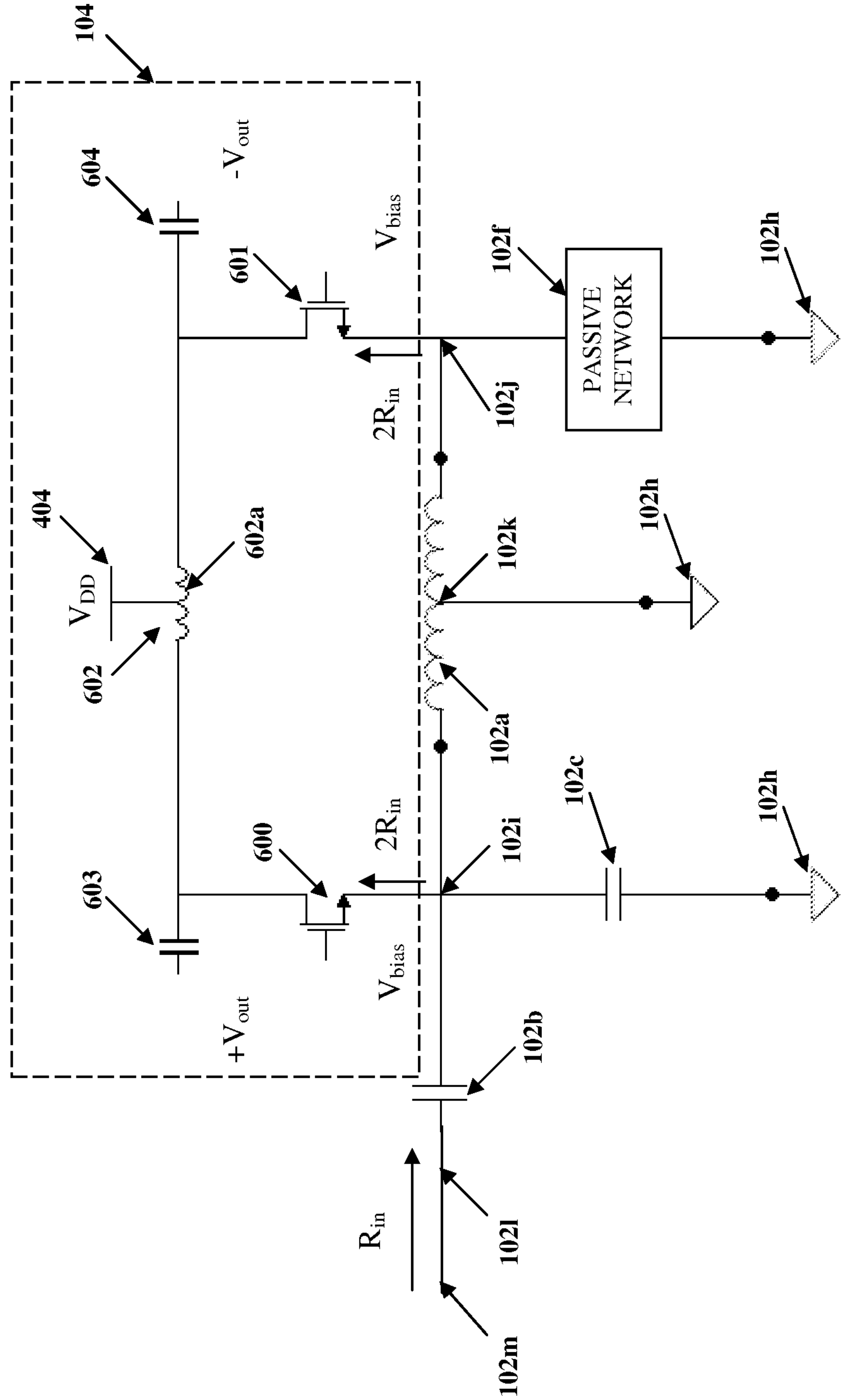
FIG. 6 exemplarily illustrates a common gate n-type metal-oxide-semiconductor field effect transistor low noise amplifier employing the electronic balun circuit.

FIG. 6 exemplarily illustrates a common gate n-type metal-oxide-semiconductor field effect transistor (n-MOSFET) low noise amplifier (LNA) 104 employing the electronic balun circuit 102. In this embodiment, the LNA 104 is, for example, a differential amplifier used to implement the first impedance circuit 102*d* and the second impedance circuit 102*e*. The LNA 104 comprises two n-type metal-oxide-semiconductor field effect transistors (n-MOSFET) 600 and 601 in a common gate configuration. Gate terminals of the n-MOSFETs 600 and 601 are biased through an appropriate bias voltage source for providing a constant bias voltage, Vbias. Furthermore, the bias voltage source can be programmed to provide predetermined constant voltage levels to adjust the constant bias voltage provided to the n-MOSFETs 600 and 601. Drain terminals of the n-MOSFETs 600 and 601 are, for example, connected to a differential load 602 comprising an inductance 602*a*. However, instead of using the inductance 602*a*, the differential load 602 for the LNA 104 may also comprise a passive component or device, for example, a resistor, a capacitor, an inductor, a diode, a transformer, and any combination thereof. A source terminal of the n-MOSFET 600 is coupled with the first node 102*i* of the center-tapped inductor 102*a* and the source terminal of the n-MOSFET 601 is coupled with the second node 102*j* of the center-tapped inductor 102*a*. The n-MOSFETS 600 and 601 in the common gate configuration are designed to provide an impedance, Rx=2Rin at each of the first node 102*i* and the second node 102*j*. For the common gate configuration of the n-MOSFETs 600 and 601, Rx=1/gmx, where gmx is trans-conductance of a MOSFET. For a differential circuit implementing n-MOSFETs 600 and 601, gmx=2*Id/(Vgs−Vt), where Id is drain current through an n-MOSFET, Vgs is voltage difference between gate terminal and source terminal, and Vt is threshold voltage. The threshold voltage Vt is the voltage at which there are sufficient electrons at the interface between insulating layer (oxide) and the substrate (body) of the n-MOSFET to create a low resistance conducting path between the n-MOSFET source and drain. For a given value of Vgs−Vt, Rx is inversely proportional to Id since gmx is directly proportional to Id. Accordingly; each n-MOSFET 600 and 601 transistor branch in the common mode configuration needs to allow the flow of only half the current for 2Rin impedance, compared to generating an impedance of Rin. For a bipolar junction transistor (BJT), gmx=Ic/$V_T$, where Ic is collector current and $V_T$ is thermal voltage. Accordingly, an impedance of 2Rin may be established at each of the first node 102*i* and the second node 102*j* by replacing the metal-oxide-semiconductor field effect transistors 600 and 601 with bipolar junction transistors. The LNA 104 provides an impedance of 2Rin at each of the first node 102*i* and the second node 102*j* of the center-tapped inductor 102*a*. The impedance of 2Rin at each of the first node 102*i* and the second node 102*j* results in a total effective impedance of Rin for a single-ended electronic signal entering the first node 102*i* from the single-ended signal source 108.

For a single-ended electronic signal provided to the first node, the electronic balun circuit 102 generates a differential electronic signal between the first node 102*i* and the second node 102*j*, which is provided as input to the LNA 104 for amplification. Output of the LNA 104 is an amplified differential electronic signal taken between outputs $+V_{out}$ and $-V_{out}$. Decoupling capacitors 603 and 604 remove DC components from the amplified differential electronic signal taken between outputs $+V_{out}$ and $-V_{out}$ respectively. The differential load 602 may also be implemented by a differential load comprising one or more passive component combinations comprising resistors, capacitors, inductors, diodes, transformers, etc.

Figure 7:
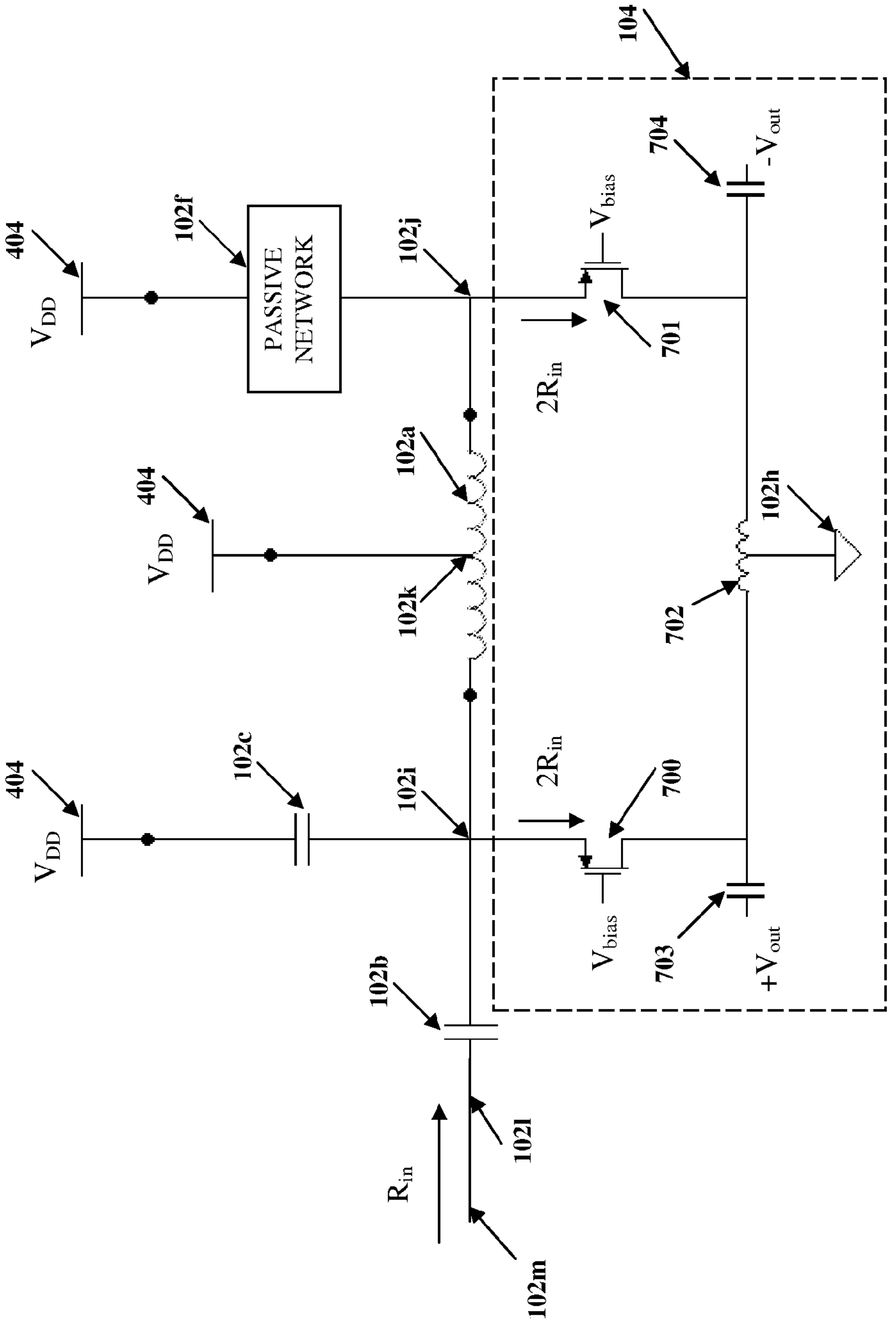
FIG. 7 exemplarily illustrates a common gate p-type metal-oxide-semiconductor field effect transistor low noise amplifier employing the electronic balun circuit.

FIG. 7 exemplarily illustrates a common gate p-type metal-oxide-semiconductor field effect transistor (p-MOSFET) a low noise amplifier (LNA) 104 employing the electronic balun circuit 102. The LNA 104 is a differential amplifier used to implement the first and second impedance circuits 102*d* and 102*e*. The LNA 104 comprises two p-type metal-oxide-semiconductor field effect transistors (p-MOSFET) 700 and 701 in a common gate configuration. Gate terminals of the p-MOSFETs 700 and 701 are biased through an appropriate bias voltage source for providing a constant bias voltage, Vbias. Furthermore, the bias voltage source can be programmed to provide predetermined constant voltage levels to adjust the constant bias voltage provided to the p-MOSFETs 700 and 701. Drain terminals of the p-MOSFETs 700 and 701 are connected to end terminals of a differential load inductance 702. Source terminal of the p-MOSFET 700 is coupled with the first node 102*i* of the center-tapped inductor 102 and the source terminal of the p-MOSFET 701 is coupled with the second node 102*j* of the center-tapped inductor 102*a*. The center-tap of the center-tapped inductor 102*a* is connected to a constant supply voltage $V_{DD}$ 404. The p-MOSFETS 700 and 701 in the common gate configuration are designed to provide an impedance, Rx=2Rin at each of the first node 102*i* and the second node 102*j*. The impedance of 2Rin at each of the first node 102*i* and the second node 102*j* results in a total effective impedance of Rin for a single-ended electronic signal entering the first node 102*i* from the single-ended signal source 108. For a single-ended electronic signal provided to the first node 102*i*, the electronic balun circuit 102 generates a differential electronic signal between the first node 102*i* and the second node 102*j*. The differential signal generated is provided as input to the LNA 104 for amplification. Output of the LNA 104 is an amplified differential electronic signal taken between outputs $+V_{out}$ and $-V_{out}$. Decoupling capacitors 703 and 704 remove DC components from the amplified differential electronic signal taken between outputs $+V_{out}$ and $-V_{out}$ respectively.

Figure 8:
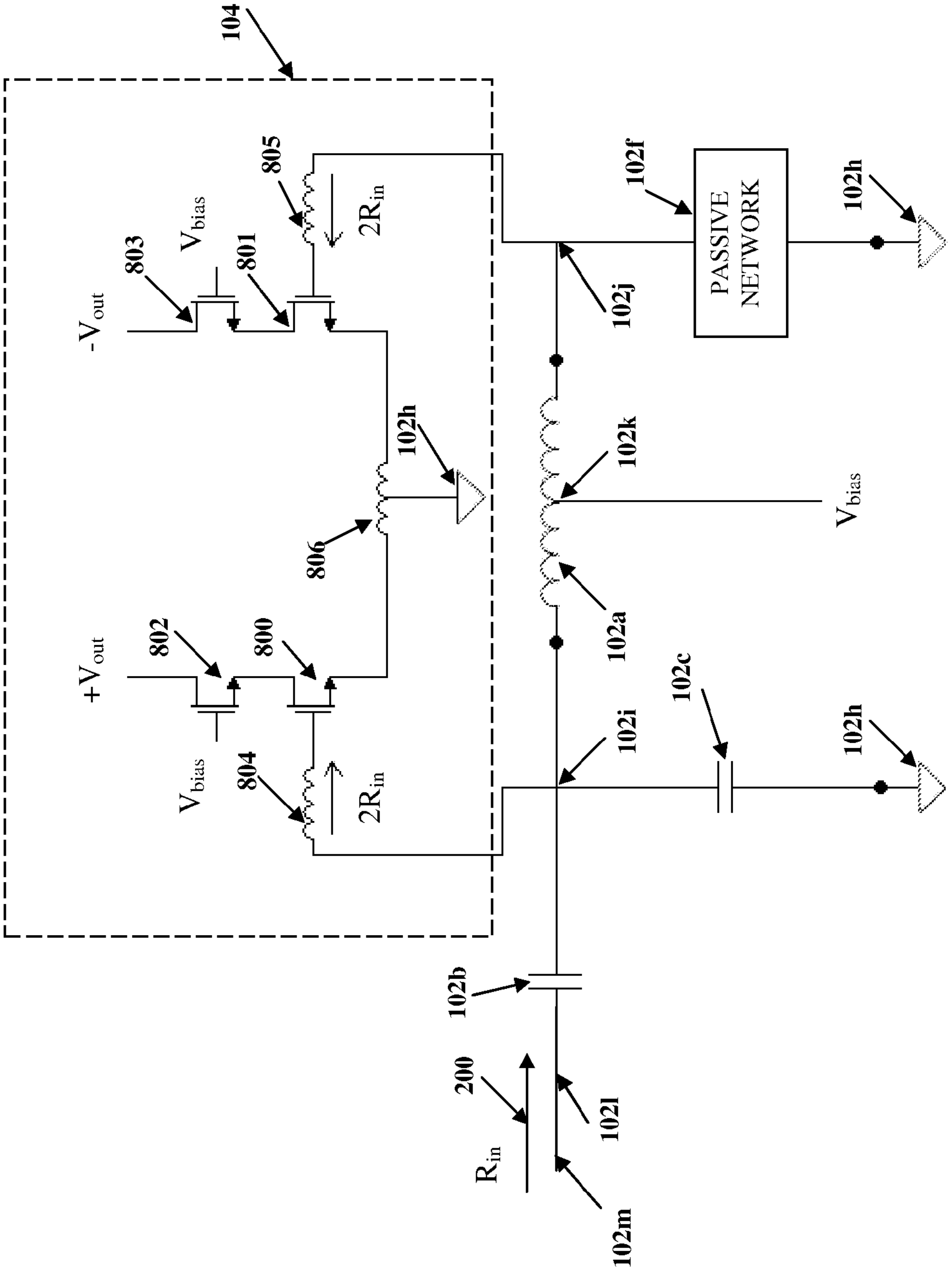
FIG. 8 exemplarily illustrates a common source n-type metal-oxide-semiconductor field effect transistor low noise amplifier employing the electronic balun circuit.

FIG. 8 exemplarily illustrates a common source n-type metal-oxide-semiconductor field effect transistor (n-MOSFET) low noise amplifier (LNA) 104 employing the electronic balun circuit 102. The low noise amplifier (LNA) 104 is a differential amplifier used to implement the first impedance circuit 102*d* and the second impedance circuit 102*e*. The low noise amplifier (LNA) 104 comprises four n-type metal-oxide-semiconductor field effect transistors (n-MOSFETs) 800, 801, 802, and 803. The n-MOSFETs 800 and 801 are arranged in a common source configuration. Source terminals of the n-MOSFETs 800 and 801 are coupled to a signal ground 102*h* through the end nodes of a differential load inductance 806 while the center-tap of the differential load inductance 806 is coupled to the signal ground 102*h*. Drain terminals of the n-MOSFETs 800 and 801 are connected to source terminals of n-MOSFETs 802 and 803. Gate terminals of the n-MOSFETs 802 and 803 are connected to an appropriate bias voltage source providing a constant bias voltage, Vbias. Furthermore, the bias voltage source can be programmed to provide predetermined constant voltage levels to adjust the constant bias voltage provided to the n-MOSFETs. The n-MOSFETS 800 and 802 are in a first cascode configuration, and n-MOSFETS 801 and 803 are in a second cascode configuration. The n-MOSFETS 800 and 801 are transconductance amplifiers of the first cascode configuration and the second cascode configuration, respectively. Furthermore, the n-MOSFETS 802 and 803 are current buffers of the first cascode configuration and the second cascode configuration, respectively. As disclosed above, the cascode configuration improves input-output isolation or reverse transmission/reverse isolation, since there is no direct coupling from the output to input. In this common source low noise amplifier (LNA) 104, devices 804, 800 and 806, and devices 805, 801 and 806 implement appropriate input impedance of 2*Rin on each of the first node 102*i* and second node 102*j* at the operating frequency. A passive network 102*f* couples the second node 102*j* to the signal ground 102*h* and is used to match the amplitude of the differential signals generated at the first node 102*i* and the second node 102*j*. The passive network 102*f* may comprise any combination of passive components comprising one or more resistors, capacitors, and inductors.

The center-tap 102*k* of the center-tapped inductor 102*a* is connected to a constant voltage source, such as the constant bias voltage Vbias. For a single-ended electronic signal provided to the first node 102*i*, the electronic balun circuit 102 converts the single-ended electronic signal into a differential electronic signal. The first of the two complementary electronic signals of the differential electronic signal can be obtained at the first node 102*i* and the second of the two complementary electronic signals can be obtained at the second node 102*j*. The low noise amplifier (LNA) 104 amplifies the first and the second complementary electronic components of the differential electronic signal and provides the amplified first complementary electronic signal (+Vout) at the drain terminal of the n-MOSFET 802 and provides the amplified second complementary electronic signal (−Vout) at the drain terminal of the n-MOSFET 803.

Figure 9A:
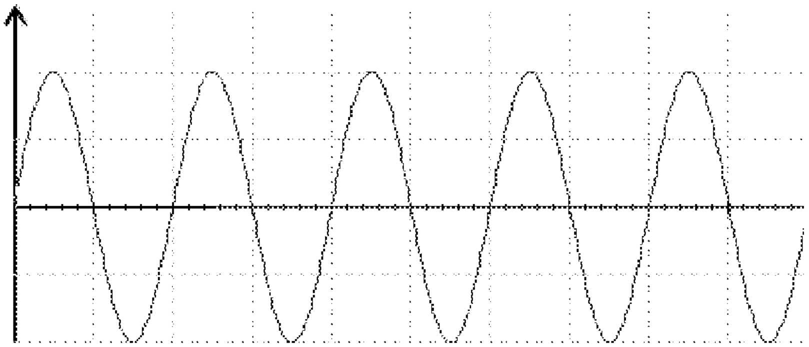
FIG. 9A exemplarily illustrates a single-ended electronic signal provided to a first node of a center-tapped inductor in an electronic balun circuit.
Figure 9B:
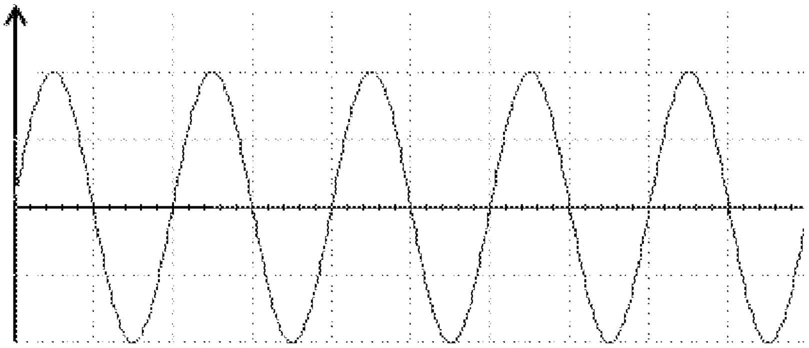
FIG. 9B exemplarily illustrates a first complementary electronic signal of a differential electronic signal available at a first node of a center-tapped inductor in an electronic balun circuit.
Figure 9C:
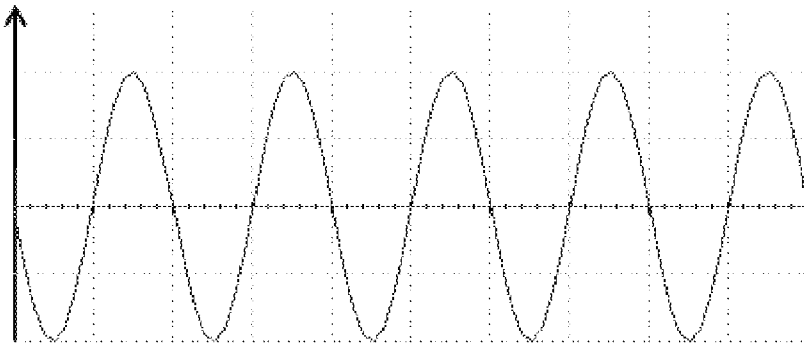
FIG. 9C exemplarily illustrates a second complementary electronic signal of a differential electronic signal available at a second node of a center-tapped inductor in an electronic balun circuit.

FIGS. 9A-9C exemplarily illustrate a single-ended electronic signal incoming towards a first node 102*i* of a center-tapped inductor 102*a* in an electronic balun circuit 102, a first complementary electronic signal of a differential electronic signal at the first node 102*i*, and a second complementary electronic signal of the differential electronic signal at a second node 102*j* of the center-tapped inductor 102*a* respectively. Waveforms representing polarities clearly illustrate conversion of a single-ended electronic signal provided at the first node 102*i* to a differential electronic signal by the electronic balun circuit 102. The first complementary electronic signal of the differential electronic signal is, for example, available at the first node 102*i* and the second complementary electronic signal of the differential electronic signal is available at the second node 102*j*. Furthermore, as disclosed in the detailed description of FIG. 2, FIG. 3, FIG. 5, and FIG. 8, the center-tap 102*k* of the center-tapped inductor 102*a* is coupled with a constant voltage source. Therefore, voltage at the center-tap is a constant value.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

I claim:

1. An electronic balun circuit for converting a single-ended electronic signal into a differential electronic signal, comprising:

a center-tapped inductor comprising a first node, a center-tap coupled with a constant voltage source, and a second node;

a first impedance circuit having an input impedance of 2Rin, wherein input of said first impedance circuit is operably coupled with said first node and with a line carrying said single-ended electronic signal to said first node, and wherein Rin is impedance of said line carrying said single-ended electronic signal;

a second impedance circuit having an input impedance of 2Rin, wherein input of said second impedance circuit is operably coupled with said second node, and wherein said first node receives said single-ended electronic signal to produce said differential electronic signal at said first node and said second node; and a capacitor for coupling said first node with a signal ground, wherein said capacitor is variable to allow said electronic balun circuit to be tuned for varying operating frequency of said electronic balun circuit;

whereby said input impedance of 2Rin of each of said first impedance circuit and said second impedance circuit results in a total effective impedance of Rin for achieving an impedance match between said line carrying said single-ended electronic signal and said first node.

2. The electronic balun circuit of claim 1, further comprising a passive network operably coupled with said second node.

3. The electronic balun circuit of claim 2, wherein said passive network comprises one or more passive components, wherein said one or more passive components are capacitors, resistors, inductors, and a combination thereof.

4. The electronic balun circuit of claim 1, wherein said first impedance circuit and said second impedance circuit comprise a plurality of transistors arranged in a differential configuration to amplify said differential electronic signal.

5. The electronic balun circuit of claim 1, further comprising a decoupling capacitor connected between said line carrying said single-ended electronic signal and said first node.

6. An electronic balun circuit for converting a differential electronic signal into a single-ended electronic signal, comprising:

a center-tapped inductor comprising a first node, a center-tap coupled with a constant voltage source, and a second node;

a first impedance circuit having an output impedance of $2R_L$, wherein output of said first impedance circuit is operably coupled with said first node and with a line carrying said single-ended electronic signal from said first node, and wherein RL is impedance of said line carrying said single-ended electronic signal;

a second impedance circuit having an output impedance of 2RL, wherein output of said second impedance circuit is operably coupled with said second node, and wherein said first node and said second node receive said differential electronic signal to produce said single-ended electronic signal at said first node; and a capacitor for coupling said first node with a signal ground, wherein said capacitor is variable to allow said electronic balun circuit to be tuned for varying operating frequency of said electronic balun circuit;

whereby said output impedance of $2R_L$ of each of said first impedance circuit and said second impedance circuit results in a total effective impedance of $R_L$ for achieving an impedance match between said line carrying said single-ended electronic signal and said first node.

7. The electronic balun circuit of claim 6, further comprising a passive network operably coupled with said second node.

8. The electronic balun circuit of claim 6, further comprising a decoupling capacitor connected between said line carrying said single-ended electronic signal and said first node.

9. An electronic balun circuit for converting a single-ended electronic signal into a differential electronic signal and vice versa, comprising:

a center-tapped inductor comprising a first node, a center-tap coupled with a constant voltage source, and a second node;

a first impedance circuit having an impedance of $2R_L$ and operably coupled with said first node and a line carrying said single-ended electronic signal to and from said first node, wherein $R_L$ is impedance of said line carrying said single-ended electronic signal;

a second impedance circuit having said impedance of $2R_L$ and operably coupled with said second node, wherein said first node receives said single-ended electronic signal to produce said differential electronic signal at said first node and said second node, and wherein said first node and said second node receive said differential electronic signal to produce said single-ended electronic signal at said first node; and a capacitor for coupling said first node with a signal ground, wherein said capacitor is variable to allow said electronic balun circuit to be tuned for varying operating frequency of said electronic balun circuit;

whereby said impedance of $2R_L$ of each of said first impedance circuit and said second impedance circuit results in a total effective impedance of RL for achieving an impedance match between said line carrying said single-ended electronic signal and said first node.

10. The electronic balun circuit of claim 9 further comprising a passive network operably coupled with said second node.

11. The electronic balun circuit of claim 10, wherein said passive network comprises one or more passive components, wherein said one or more passive components are capacitors, resistors, inductors, and a combination thereof.

12. The electronic balun circuit of claim 9, wherein said first impedance circuit and said second impedance circuit comprise a plurality of transistors arranged in a differential configuration to amplify said differential electronic signal.

13. The electronic balun circuit of claim 9, further comprising a decoupling capacitor connected between said line carrying said single-ended electronic signal and said first node.

14. A method for converting a single-ended electronic signal to a differential electronic signal, comprising coupling a center-tap of a center-tapped inductor with a constant voltage source;

operably coupling a first node of said center-tapped inductor with input of a first impedance circuit having an input impedance of 2Rin and with a line carrying said single-ended electronic signal to said first node, wherein Rin is impedance of said line carrying said single-ended electronic signal;

coupling said first node to a signal ground through a capacitor, wherein said capacitor is variable to allow said electronic balun circuit to be tuned for varying operating frequency of said electronic balun circuit;

operably coupling a second node of said center-tapped inductor with input of a second impedance circuit having an input impedance of 2Rin, wherein said input impedance of 2Rin of each of said first impedance circuit and said second impedance circuit, result in a total effective impedance of Rin for achieving an impedance match between said line carrying said single-ended electronic signal and said first node;

providing said single-ended electronic signal to said first node of said center-tapped inductor, wherein said single-ended electronic signal at windings between said first node and said center-tap induces a complementary electronic signal of said single-ended electronic signal at windings between said center-tap and said second node; and receiving said differential electronic signal comprising said single-ended electronic signal at said first node and said complementary electronic signal of said single-ended electronic signal at said second node of said center-tapped inductor.

15. A method for converting a differential electronic signal to a single-ended electronic signal, comprising:

coupling a center-tap of a center-tapped inductor with a constant voltage source;

operably coupling a first node of said center-tapped inductor with a first impedance circuit having an output impedance of $2R_L$ and with a line carrying said single-ended electronic signal from said first node, wherein $R_L$ is impedance of said line carrying said single-ended electronic signal;

coupling said first node to a signal ground through a capacitor, wherein said capacitor is variable to allow said electronic balun circuit to be tuned for varying operating frequency of said electronic balun circuit;

operably coupling a second node of said center-tapped inductor with a second impedance circuit having an output impedance of $2R_L$, wherein said output impedance of $2R_L$ of said first impedance circuit and said second impedance circuit, in combination, result in a total effective impedance of $R_L$ for achieving an impedance match between said line carrying said single-ended electronic signal and said first node;

providing a first of two complementary electronic signals of said differential electronic signal to said first node and a second of said two complementary electronic signals to said second node of said center-tapped inductor, wherein said second complementary electronic signal at windings between said second node and said center-tap induces a complement of said second complementary electronic signal at windings between said first node and said center-tap, and wherein said first complementary electronic signal and said complement of said second complementary electronic signal add up constructively to generate said single-ended electronic signal at said first node; and sending said single-ended electronic signal to said line carrying said single-ended signal.

* * * * *